March 26, 1963
J. GODFREY ET AL
3,083,320
PROTECTIVE ELEMENT FOR HERMETICALLY ENCLOSED SEMICONDUCTOR DEVICES
Filed Dec. 1, 1960
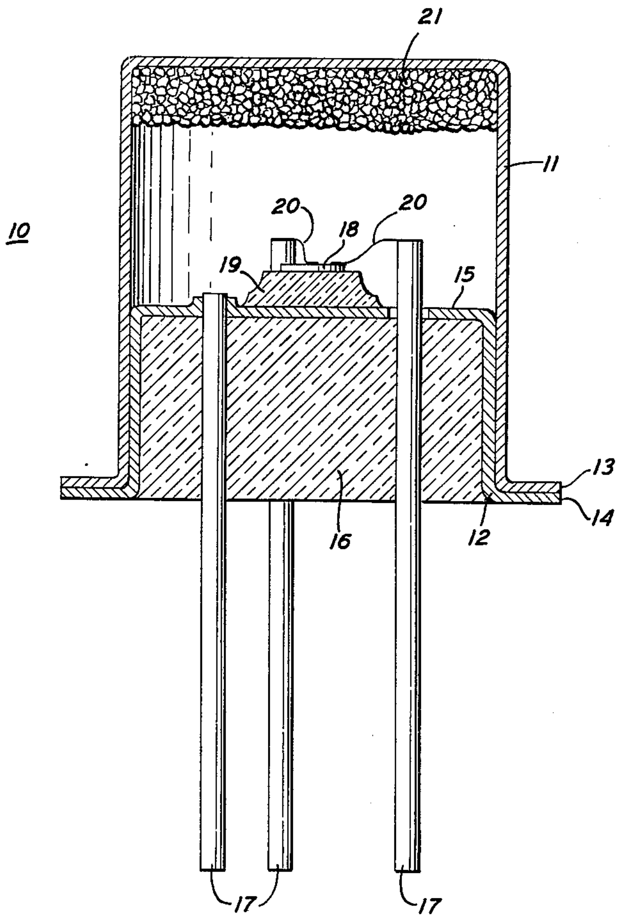
INVENTORS J. GODFREY
E. A. THURBER
BY H. W. Lockhart
ATTORNEY United States Patent Office 3,083,320
Patented Mar. 26, 1963

3,083,320

PROTECTIVE ELEMENT FOR HERMETICALLY ENCLOSED SEMICONDUCTOR DEVICES

James Godfrey, Reading, and Elmer A. Thurber, Bethlehem, Pa., assignors to Bell Telephone Laboratories, Incorporated, New York, N.Y., a corporation of New York Filed Dec. 1, 1960, Ser. No. 73,140
3 Claims. (Cl. 317—234)

This invention relates to semiconductor devices and, more particularly, to an advantageous arrangement including an improved gettering element for encapsulating a semiconductor device.

It appears well established that the nature and content of the atmosphere surrounding a semiconductor body, such as a transistor or diode, can affect certain of its electrical characteristics. More specifically, it is now well known that water vapor, even in trace amounts, adversely affects the long-term electrical characteristics of semiconductor devices, particularly transistors.

As a consequence, there has developed in the art a variety of arrangements for encapsulating semiconductor devices ranging from special surface coatings and the like to rather widely used metal and glass or ceramic envelopes which may be exhausted to a high degree or filled with controlled atmospheres. Moreover, it is known to include within the latter envelopes desiccants, such as powdered glass or silica gel, for inhibiting the deleterious effects of water vapor.

However, for devices having the highest degree of reliability and stability of original electrical characteristics there is a need for improved arrangements for protecting the surfaces of the semiconductor bodies, particularly those of silicon and germanium. In accordance with this invention, there is provided within the envelope enclosing the semiconductor device a simple but highly efficient agent for gettering deleterious materials by chemisorbency during the extended life of the device. Specifically, it has been found that a mixture of activated alkaline earth oxides carried in a porous metal matrix can be included readily within many of the various types of semiconductor device envelopes. In particular, a porous nickel matrix impregnated with barium and strontium oxides is most advantageous in absorbing relatively large quantities of water vapor as well as for inhibiting the presence of other deleterious gases. In particular, such an oxide-nickel structure may be formed in a variety of shapes and sizes economically and conveniently to conform to the interior of semiconductor device envelopes.

Thus, a primary object of this invention is to improve the stability and reliability of semiconductor devices.

A particular object of this invention is to inhibit the contamination of semiconductor device surfaces over long periods of time and to a degree hitherto not attained.

It is a feature of this invention to mount within a semiconductor device envelope an element comprising a supporting porous metal matrix impregnated with a mixture of barium and strontium oxides. In particular, it is a feature of this invention to fabricate sintered matrices of metals such as nickel, copper, and Kovar.

The invention and its other objects and features will be more clearly understood from the following detailed description taken in connection with the drawing which shows in cross-section schematically a typical metal envelope for a semiconductor device including a gettering element in accordance with this invention.

Turning to the drawing, there is shown in schematic cross-section a transistor 10 in an air-tight hermetic envelope. The envelope comprises two basic parts: a metal can 11 and a header assembly 12 which are joined together by conventional welding techniques, either hot or cold, along a pair of flanges 13 and 14. The header assembly 12, typically, is a metal cap 15 with an insulating glass insert 16 for supporting a number of metal leads 17 which provide the terminals for the device. The semiconductor wafer 18 is mounted on a platform 19, in turn, supported from the header assembly. Fine wire leads 20 are joined to the electrode areas on the semiconductor wafer 18 and attached to their respective terminal leads 17.

Thus, the transistor element, which typically is of the diffused junction type having a plurality of conductivity-type regions defining PN junctions therebetween, is exposed to the ambient atmosphere within the hermetically sealed envelope. Customarily, the device assembly is subjected to a rigid cleaning and drying procedure before the final sealing operation which joins the can 11 to the header assembly 12. However, despite the utmost precautions, a small residue of contaminants, primarily water vapor, remains within the envelope after sealing off. Even the smallest amount of contaminants has been found to deteriorate the long-time stability of semiconductor devices of the type described. This is particularly true of devices fabricated for use in systems designed for military use or uses in which long lifetime, such as submarine cable repeaters, is essential.

In accordance with this invention, there is placed within the metallic can 11 an element 21 composed of a porous metallic matrix which has been impregnated with activated oxides of alkaline earth metals, typically, the oxides of barium and strontium produced from the reaction of the carbonates of these metals. As shown in the drawing, the gettering element 21 is in the form of a disc and, as shown in cross-section, comprises a porous nickel matrix which has been impregnated with activated material without appreciably coating the exterior surface. This element 21 may be conveniently secured within the housing by any of several techniques, one of the most advantageous being to coat one face of the gettering disc 21 lightly with an evaporated metal, such as gold. The disc then may be brazed into the top of the can 11 by heating, typically, at 950 degrees centigrade in a hydrogen atmosphere using a gold-copper brazing alloy, a nickel or Kovar can, and a gold coated disc. This is advantageous since the heating operation serves also to activate the gettering element by reduction of the carbonates to their respective oxides. The disc may also be secured within the housing by other methods such as by clips welded to the walls of the can 11 or by other expedients.

The gettering element 21 is fabricated advantageously by first preparing a stainless steel mold in the form of a shallow pan. Another suitable material for the mold is Inconel plate having a thickness of three-sixteenths of an inch. After chemically cleaning and oxidizing the mold in wet hydrogen at 1000 degrees centigrade, a uniform layer of coarse carbonyl nickel powder is spread over the mold surface to a depth of about 0.05 inch or flush with the rim of the shallow pan. The carbonyl nickel powder is of a size capable of passing through a 200 to 400 standard mesh screen. The mold containing the layer of powder is then heated at 1100 degrees centigrate in wet hydrogen for from 15 to 20 minutes to sinter the powder. After cooling, the sintered slab of nickel is removed from the mold and cut into rectangular sections of convenient size for impregnation, such as one by three inches. Next, each of the sections is lowered carefully into a suspension of barium and strontium carbonates. The porous nickel matrix, in effect, is floated on the suspension until it is thoroughly and uniformly soaked as evidenced by the white suspension material exuding through the pores onto the top surface. This customarily requires 5 to 10 seconds' immersion. Total immersion is unnecessary and undesirable. The aim of the process is an element impregnated substantially completely with the suspension but retaining the maximum possible porosity and thus the maximum active surface. To this end it is undesirable to provide the gettering element with a complete surface coating which would "seal" its porosity. The impregnated sheet is then removed from the suspension, allowed to dry in a gentle stream of clean air with slight warming at a temperature of 50 to 60 degrees centigrade.

A suitable suspension of impregnating material is made up of the following materials in the proportions stated:

| | Percent by weight |
|---|---|
| Barium carbonate | 22.0 |
| Strontium carbonate | 16.5 |
| Amyl acetate | 57.5 |
| Nitrocellulose | 4.0 |

This suspension is made up by adding to a ball jar, which is one-third full of flint pebbles, 360 grams of barium carbonate, 270 grams strontium carbonate, 65 grams of nitrocellulose and 600 milliliters of amyl acetate. The ball jar is closed and rolled for 96 hours. After this the mixture is transferred to a 1000 milliliter beaker and 280 milliliters of amyl acetate are added and the jar is again closed and rolled for about ten minutes. After this the mixture is ready for use as an impregnant. Because it is a suspension it is essential to agitate the mixture adequately before use for impregnation of the nickel matrices.

Although the above-described impregnant material has been found to perform advantageously, it will be understood that the particular formulation disclosed is not critical. Thus, there is a considerable range of alkaline earth metals, compounds and mixtures thereof which may be used. Moreover, amyl acetate is a convenient suspending agent but merely is representative of a class of materials which may be so used.

After the rectangular sections have been impregnated and dried, they are compressed to flatten and strengthen the sheet. Typically, this compression may total about 10 to 20 mils. For example, the thickness of the sheet before compression may be 45 to 50 mils and after compression 30 to 35 mils.

Next, discs of the desired diameter, typically one-eighth inch, are punched out of the rectangular sections. If the discs are to be brazed into the metallic housing, the compressed rectangular sections may be subjected to an evaporated gold coating on one face before the discs are punched out. Unless the gettering elements are to be assembled immediately into semiconductor device envelopes, advantageously they should be stored in a desiccator or under vacuum to prevent contamination.

The final installation of the gettering element 21 is made by inserting the disc into the top of the can 11 with a suitable brazing alloy and the assembly is heated in dry hydrogen at from 950 to 1100 degrees centigrade for 10 to 15 minutes. This heat treatment serves both to braze the disc by way of the gold coating to the interior of the can and to activate the gettering element by converting the carbonates of barium and strontium to oxides.

It will be apparent that although in this embodiment the disc form of gettering element is convenient and economical for use in the type of envelope shown, the gettering element can be fabricated in a variety of shapes. Moreover, an alternative technique for producing the element 21 is to employ an ordinary tableting machine of the type used for pressing out pills from powdered material. Such a machine may be used to produce the metal matrix in disc form by compression, which then may be sintered by heating and then impregnated as described above. Such an arrangement could be used to fabricate any one of a variety of desired shapes, such as cylinders or hemispheres, by compression depending upon the particular envelope arrangement used.

Materials other than nickel may be used as a foundation for the gettering element 21. Generally, any chemically stable material capable of being formed into a porous agglomerate is suitable. In particular, other metals such as copper and Kovar may be used and also nonmetals of the ceramic type such as alumina.

Moreover, in certain applications it may be desirable to fabricate the gettering element in situ within the envelope rather than separately for subsequent mounting. In particular, the porous base matrix may be produced by depositing and sintering a layer within a part of the envelope and then impregnating by dispensing a measured amount of active material directly into the matrix. This arrangement provides a particular rugged structure which is less susceptible to breaking up into particles which might affect the semiconductor device.

The particular alkaline earth compounds disclosed herein are extremely useful as gettering elements because of their capability of holding relatively large amounts of water vapor. For example, the disc element 21, described herein as having a diameter of about one-eighth of an inch and a total thickness of 30 to 35 mils and containing about 4 milligrams of active oxides, will hold about three-tenths milligram of water or, typically, approximately ten times the amount of water vapor that might be present at standard temperature and pressure in the empty space of the housing illustrated in the drawing. Although other alkaline earth oxides, or mixtures thereof, likewise may be used, the specified mixture of barium and strontium compounds is preferred because of inherent activity and stability. In one aspect, the particular advantage of the gettering agent of this invention results from its chemical absorbency as contrasted to the physical adsorption characteristic of prior art systems. Other alkaline earth compounds of metals, such as calcium, may be used.

Although the invention has been disclosed in terms of certain specific embodiments, it will be understood that other arrangements may be devised by those skilled in the art which will be within the scope and spirit of the invention. In particular, although the specific embodiment relates to a transistor the invention likewise is advantageously used for a wide variety of semiconductor devices including diodes.

What is claimed is:

1. A semiconductor device including a sealed envelope enclosing an evacuated space and a gettering element within said envelope, said element comprising a porous sintered nickel matrix impregnated with activated oxides of alkaline earth metals including barium, for substantially impregnating the interstices of said nickel matrix, said element being brazed to the interior of said envelope.

2. The method of fabricating a semiconductor device which comprises preparing a gettering element by impregnating a porous metal matrix in a suspension including barium and strontium carbonates, heating said element at an elevated temperature to convert said carbonates to activated oxides, and hermetically sealing said gettering element within a semiconductor envelope.

3. The method in accordance with claim 2 in which said matrix is formed within said envelope and then impregnated with said suspension.

References Cited in the file of this patent

UNITED STATES PATENTS

| | | |
|---|---|---|
| 1,752,748 | Lederer | Apr. 1, 1930 |
| 1,993,767 | Allen | Mar. 12, 1935 |
| 2,664,528 | Stelmak | Dec. 29, 1953 |